(12) United States Patent
Minemura

(10) Patent No.: US 10,957,574 B2
(45) Date of Patent: Mar. 23, 2021

(54) ELECTROSTATIC CHUCK AND SUBSTRATE FIXING APPARATUS

(71) Applicant: SHINKO ELECTRIC INDUSTRIES CO., LTD., Nagano (JP)

(72) Inventor: Tomotake Minemura, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 172 days.

(21) Appl. No.: 16/434,226

(22) Filed: Jun. 7, 2019

(65) Prior Publication Data

US 2019/0393068 A1    Dec. 26, 2019

(30) Foreign Application Priority Data

Jun. 20, 2018  (JP) .............................. JP2018-117331

(51) Int. Cl.
*H01L 21/683* (2006.01)
*H01L 21/67* (2006.01)
*H01L 35/30* (2006.01)
*H01J 37/32* (2006.01)

(52) U.S. Cl.
CPC .... *H01L 21/6833* (2013.01); *H01J 37/32724* (2013.01); *H01L 21/67103* (2013.01); *H01L 21/67248* (2013.01); *H01L 35/30* (2013.01); *H01J 2237/002* (2013.01); *H01J 2237/24585* (2013.01); *H01J 2237/334* (2013.01)

(58) Field of Classification Search
CPC ........... H01J 37/32724; H01J 2237/002; H01J 2237/24585; H01J 2237/334; H01L 21/6833; H01L 21/67103; H01L 21/67248; H01L 35/30

See application file for complete search history.

(56) References Cited

U.S. PATENT DOCUMENTS

| | | | | |
|---|---|---|---|---|
| 2004/0011781 A1* | 1/2004 | Ito | .......................... | H05B 3/265 |
| | | | | 219/444.1 |
| 2009/0100841 A1* | 4/2009 | Kahn | ...................... | H01L 35/30 |
| | | | | 62/3.2 |
| 2011/0005686 A1* | 1/2011 | Tanaka | .............. | H01L 21/68792 |
| | | | | 156/345.52 |

(Continued)

FOREIGN PATENT DOCUMENTS

JP    2000-286331    10/2000

*Primary Examiner* — Kyle J Moody
*Assistant Examiner* — Lakaisha Jackson
(74) *Attorney, Agent, or Firm* — IPUSA, PLLC

(57) ABSTRACT

An electrostatic chuck includes a base having a support surface configured to retain a retaining target by electrostatic retention, and a thermocouple configured to detect a temperature of the base. The thermocouple includes first and second metal parts provided inside the base and having ends connected to each other to form a measuring junction, a first wire part having one end connected to the other end of the first metal part inside the base, and another end extending outside the base, and a second wire part having one end connected to the other end of the second metal part inside the base, and another end extending outside the base. The first metal part and the first wire part are formed from a first material, and the second metal part and the second wire part are formed from a second material different from the first material.

15 Claims, 5 Drawing Sheets

(56) References Cited

U.S. PATENT DOCUMENTS

2011/0297082 A1* 12/2011 Watanabe ................. C23C 4/02
                                                            118/663
2018/0144955 A1*  5/2018 Seog .................... H05B 3/0047
2019/0293496 A1*  9/2019 Mothe .................... H01L 35/30

* cited by examiner 

ELECTROSTATIC CHUCK AND SUBSTRATE FIXING APPARATUS

CROSS-REFERENCE TO RELATED APPLICATION

This application is based upon and claims priority to Japanese Patent Application No. 2018-117331, filed on Jun. 20, 2018, the entire contents of which are incorporated herein by reference.

FIELD

Certain aspects of the embodiments discussed herein are related to an electrostatic chuck and a substrate fixing apparatus.

BACKGROUND

Conventionally, film foaming apparatuses, such as Chemical Vapor Deposition (CVD) apparatuses and Physical Vapor Deposition (PVD) apparatuses, and plasma etching apparatuses, that are used when manufacturing semiconductor devices such as an Integrated Circuit (IC) and a Large Scaled Integrated (LSI) circuit, are provided with a stage. This stage is used to accurately retain a wafer within a vacuum processing chamber. A substrate fixing apparatus, that retains the wafer within the vacuum processing chamber by electrostatic retention using an electrostatic chuck mounted on a base plate, is an example of such a stage.

The electrostatic chuck may have a structure including a heater element for adjusting the temperature of the wafer. In this case, a thermocouple is embedded within the electrostatic chuck, and the wafer temperature is adjusted by controlling the heater element in accordance with the temperature of the electrostatic chuck detected by the thermocouple, as proposed in Japanese Laid-Open Patent Publication No. 2000-286331, for example.

However, according to the proposed structure described above, the thermocouple is provided only within the electrostatic chuck having a small temperature distribution. For this reason, an appropriate temperature difference is not easily generated at the thermocouple, and it is difficult to obtain a large thermal electromotive force. As a result, it is difficult to accurately measure the temperature of the electrostatic chuck.

SUMMARY

Accordingly, it is an object in one aspect of the embodiments to provide an electrostatic chuck and a substrate fixing apparatus, that enable accurate temperature measurement of the electrostatic chuck.

According to one aspect of the embodiments, an electrostatic chuck includes a base having a support surface configured to retain a retaining target by electrostatic retention; and a thermocouple configured to detect a temperature of the base, wherein the thermocouple includes a first metal part and a second metal part that are provided inside the base, wherein one end of the first metal part and one end of the second metal part are connected to each other to form a measuring junction, a first wire part having one end connected to the other end of the first metal part inside the base, and another end extending outside the base, and a second wire part having one end connected to the other end of the second metal part inside the base, and another end extending outside the base, wherein the first metal part and the first wire part are formed from a first material, and wherein the second metal part and the second wire part are formed from a second material different from the first material.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
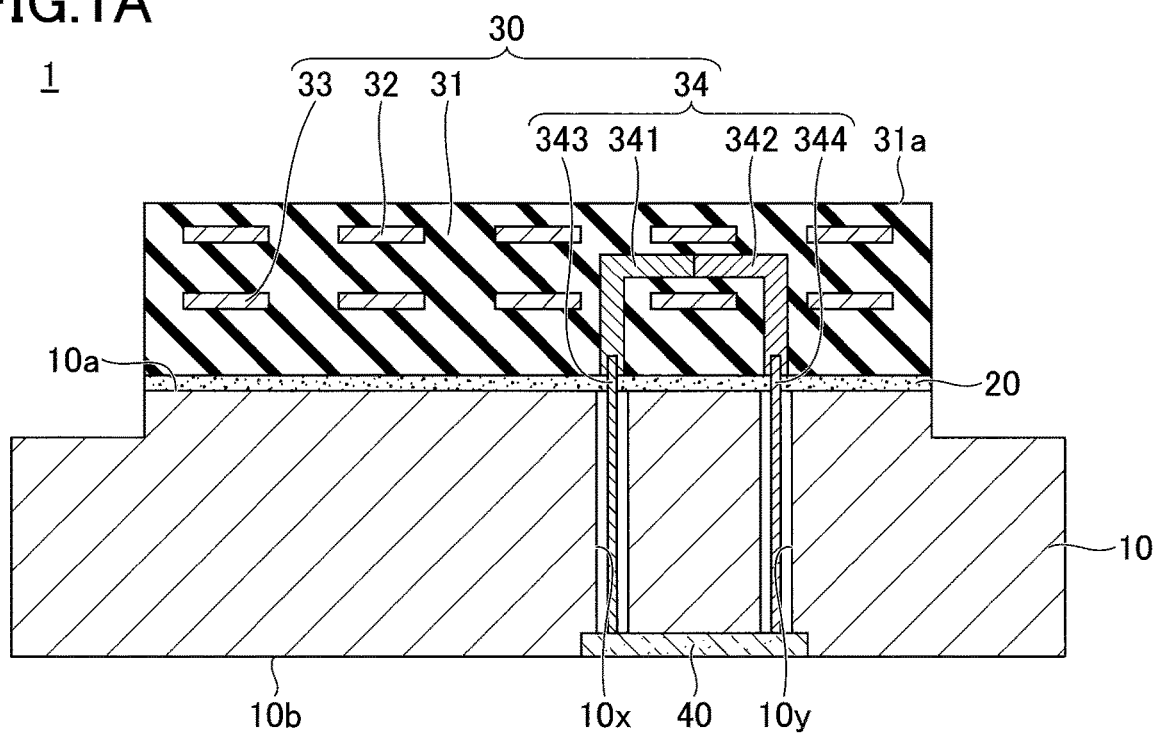
FIG. 1A and FIG. 1B are diagrams illustrating a simplified example of a substrate fixing apparatus according to a first embodiment.

Preferred embodiments of the present invention will be described with reference to the accompanying drawings. In the drawings, those parts that are the same are designated by the same reference numerals, and a repeated description of the same parts may be omitted.

An electrostatic chuck and a substrate fixing apparatus in each embodiment according to the present invention will be described below.

First Embodiment

[Structure of Substrate Fixing Apparatus]

Figure 1B:
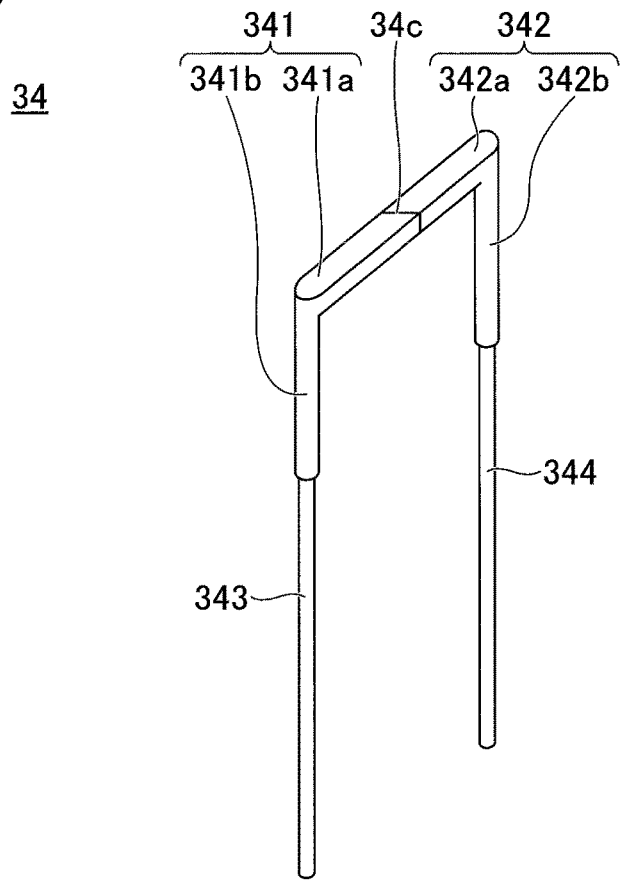

FIG. 1A and FIG. 1B are diagrams illustrating a simplified example of the substrate fixing apparatus in a first embodiment. FIG. 1A depicts a cross section of the substrate fixing apparatus, and FIG. 1B depicts a partial enlarged perspective view of only a thermocouple of the substrate fixing apparatus illustrated in FIG. 1A.

As illustrated in FIG. 1A and FIG. 1B, a substrate fixing apparatus 1 includes a base plate 10, bonding layer 20, an electrostatic chuck 30, and a controller 40. The electrostatic chuck 30 is mounted on one surface 10a of the base plate 10, and the substrate fixing apparatus 1 retains a retaining target by electrostatic retention using the electrostatic chuck 30. For example, the retaining target is a substrate, such as a wafer or the like.

The base plate 10 forms a member on which the electrostatic chuck 30 is mounted. The base plate 10 may have a thickness of approximately 20 mm to approximately 50 mm, for example. The base plate 10 may be made of aluminum, for example, and may be utilized as an electrode or the like for controlling plasma. By supplying predetermined high-frequency power to the base plate 10, it is possible to control the energy for causing collision of generated ions or the like, in the plasma state, with respect to the substrate (for example, wafer) that is retained on the electrostatic chuck 30 by the electrostatic retention, to effectively perform an etching process.

A coolant channel may be provided inside the base plate 10. In this case, the coolant channel is connected to a coolant controller that is provided externally to the substrate fixing apparatus 1. The coolant controller controls the supply of a coolant to and the discharge of the coolant from the coolant channel. The coolant may be cooling water, for example. By circulating the coolant through the coolant channel using the coolant controller to cool the base plate 10, it is possible to cool the substrate that is retained on the electrostatic chuck 30 by the electrostatic retention. A gas channel or the like, for introducing an inert gas, may be provided in the base plate 10, in addition to the coolant channel, to cool the substrate that is retained on the electrostatic chuck 30 by the electrostatic retention.

The electrostatic chuck 30 is fixed on the base plate 10 via the bonding layer 20. The electrostatic chuck 30 may be made of ceramics, for example. The bonding layer 20 may be made of a silicone bonding adhesive, for example. The bonding layer 20 may have a thickness of approximately 0.5 mm to approximately 2 mm, for example. The bonding layer 20 preferably has a thermal conductivity of approximately 2 W/mK or higher. The bonding layer 20 may be formed as a single layer, however, the bonding layer 20 preferably has a 2-layer structure formed by a combination of a first bonding adhesive having a high thermal conductivity, and a second bonding adhesive having a low elastic modulus. In this case, it is possible to obtain the effect of reducing stress caused by a difference between the coefficient of thermal expansion of the ceramic electrostatic chuck 30 and the coefficient of thermal expansion of the aluminum base plate 10.

The electrostatic chuck 30 includes a base 31, an electrostatic electrode 32, a heater element 33, and a thermocouple 34. The electrostatic chuck 30 may be formed by a Coulomb force type electrostatic chuck, for example. Alternatively, the electrostatic chuck 30 may be formed by a Johnsen-Rahbeck type electrostatic chuck, for example.

The base 31 includes a support surface 31a for supporting the substrate (for example, wafer) that is the retaining target, and the substrate is retained on the support surface 31a by electrostatic retention. The base 31 may be made of a dielectric, such as ceramics including aluminum oxide ($Al_2O_3$), aluminum nitride (AlN), or the like, for example. The base 31 may have a thickness of approximately 1 mm to approximately 10 mm, for example. The base 31 may have a dielectric constant at 1 kHz of approximately 9 to approximately 10, for example.

The electrostatic electrode 32 is formed by a thin-film electrode, for example, and may be embedded within the base 31. The electrostatic electrode 32 is electrically connected to a power source that is provided externally to the substrate fixing apparatus 1. By applying a predetermined voltage from the power source to the electrostatic electrode 32, an electrostatic retention force (or Coulomb force) is generated between the electrostatic electrode 32 and the substrate that is the retaining target. As a result, it is possible to retain the substrate on the support surface 31a of the base 31 by the electrostatic retention. The electrostatic retention force becomes stronger as the voltage applied to the electrostatic electrode 32 increases. The electrostatic electrode 32 may have a mono-pole shape or a dipole shape. The electrostatic electrode 32 may be made of a material such as tungsten (W), molybdenum (Mo), or the like, for example.

The heater element 33 may be embedded within the base 31, and is electrically connected to the controller 40 via a wiring that is not illustrated in FIG. 1A. By applying a voltage from the controller 40 to the heater element 33, the heater element 33 generates heat so that the support surface 31a of the base 31 is heated to a predetermined temperature. The heater element 33 may heat the support surface 31a of the base 31 to a temperature of approximately 250° C. to approximately 300° C., for example. The heater element 33 may be made of a material such as copper (Cu), tungsten (W), nickel (Ni), or the like, for example.

The thermocouple 34 is an example of a temperature sensor or a temperature detection means that detects the temperature of the base 31. The thermocouple 34 includes a first metal part 341, a second metal part 342, a first wire part 343, and a second wire part 344. The first metal part 341 and the second metal part 342 are respectively foamed to an approximate L-shape, and are embedded within the base 31. The first metal part 341 and the second metal part 342 are covered by the base 31. One end of the first metal part 341 and one end of the second metal part 342 are connected to each other, to form a measuring junction 34c.

The first metal part 341 includes a first horizontal portion 341a, and a first vertical portion 341b. The first horizontal portion 341a extends in a direction parallel to the support surface 31a, and the measuring junction 34c is provided on one end of the first horizontal portion 341a. The first vertical portion 341b extends in a direction perpendicular to the support surface 31a from the other end of the first horizontal portion 341a, and one end of the first vertical portion 341b is exposed from the base 31. The first horizontal portion 341a and the first vertical portion 341b are integrally formed from the same material. A cross sectional shape of the first vertical portion 341b may be circular, for example. In this case, a diameter of the first vertical portion 341b may be greater than a width of the first horizontal portion 341a.

The second metal part 342 includes a second horizontal portion 342a, and a second vertical portion 342b. The second horizontal portion 342a extends in the direction parallel to the support surface 31a, and the measuring junction 34c is provided on one end of the second horizontal portion 342a. The second vertical portion 342b extends in the direction perpendicular to the support surface 31a from the other end of the second horizontal portion 342a, and one end of the second vertical portion 342b is exposed from the base 31. The second horizontal portion 342a and the second vertical portion 342b are integrally formed from the same material. A cross sectional shape of the second vertical portion 342b may be circular, for example. In this case, a diameter of the second vertical portion 342b may be greater than a width of the second horizontal portion 342a.

In the example illustrated in FIG. 1B, the first horizontal portion 341a and the second horizontal portion 342a are connected to form a straight line when viewed in a normal direction to the support surface 31a, however, the first and second horizontal portions 341a and 342a may be connected to extend in other directions. For example, the first horizontal portion 341a and the second horizontal portion 342a may be connected to form a straight line that is inclined by an angle when viewed in the normal direction to the support surface 31a. In addition, the first horizontal portion 341a and the second horizontal portion 342a may include a portion that is folded or curved when viewed in the normal direction to the support surface 31a.

The first horizontal portion 341a and the second horizontal portion 342a may be arranged at positions different from the positions of the electrostatic electrode 32 and the heater element 33 along the thickness direction of the base 31, that is, arranged on different planes inside the base 31, for example.

In this specification, "parallel" to the support surface 31a not only refers to a strictly parallel case, and also includes approximately parallel cases. Similarly, "perpendicular" to the support surface 31a not only refers to a strictly perpendicular case, and also includes approximately perpendicular cases. More particularly, "approximately parallel" to the support surface 31a refer to cases, including the strictly parallel case, and the cases where there is a deviation in a range of approximately ±10 degrees from the strictly parallel case. Similarly, "approximately perpendicular" to the support surface 31a refer to cases, including the strictly perpendicular case, and the cases where there is a deviation in a range of approximately ±10 degrees from the strictly perpendicular case.

One end of the first wire part 343 is connected to the other end of the first metal part 341 (end part of the first vertical portion 341b) inside the base 31, and the other end of the first wire part 343 extends outside the base 31. The first wire part 343 extending outside the base 31, passes through the bonding layer 20, and is inserted into a through-hole 10x provided in the base plate 10. The other end of the first wire part 343 is electrically connected to the controller 40 that is arranged on the other surface 10b of the base plate 10. An insulator is preferably arranged between inner walls defining the through-hole 10x and the first wire part 343.

One end of the second wire part 344 is connected to the other end of the second metal part 342 (end part of the second vertical portion 342b) inside the base 31, and the other end of the second wire part 344 extends outside the base 31. The second wire part 344 extending outside the base 31, passes through the bonding layer 20, and is inserted into a through-hole 10y provided in the base plate 10. The other end of the second wire part 344 is electrically connected to the controller 40 that is arranged on the other surface 10b of the base plate 10. An insulator is preferably arranged between inner walls defining the through-hole 10y and the second wire part 344.

The first metal part 341 and the first wire part 343 are formed from the same material (or first material) having a predetermined temperature coefficient of resistance. In addition, the second metal part 342 and the second wire part 344 are formed from the same material (or second material) having a temperature coefficient of resistance different from the predetermined temperature coefficient of resistance of the first metal part 341 and the first wire part 343. Hence, the thermocouple 34 can generate a thermal electromotive force by temperature differences between the measuring junction 34c at the joint between the first metal part 341 and the second metal part 342, and the other end of the first wire part 343 and the other end of the second wire part 344.

The material used for the first metal part 341 and the first wire part 343, and the material used for the second metal part 342 and the second wire part 344, are preferably conductive materials having a melting point higher than a firing temperature of the base 31. The firing temperature of the base 31 may be approximately 1500° C., for example. Accordingly, the firing of the first metal part 341 and the firing of the second metal part 342 may be performed simultaneously with the firing of the base 31. Examples of the conductive materials having a melting point higher than the firing temperature of the base 31 may include the materials explained below.

Examples of the conductive materials used for the first metal part 341 and the first wire part 343 include an alloy of tungsten (W) and 5 weight percent (wt %) of rhenium (Re), for example. Examples of the conductive materials used for the second metal part 342 and the second wire part 344 include an alloy of tungsten (W) and 26 wt % of rhenium (Re), for example.

Examples of the conductive materials used for the first metal part 341 and the first wire part 343 may include an alloy of platinum (Pt) and 6 wt % of rhodium (Rh), for example. Examples of the conductive materials used for the second metal part 342 and the second wire part 344 may include an alloy of platinum (Pt) and 30 wt % of rhodium (Rh), for example.

Although the example of the substrate fixing apparatus 1 illustrated in FIG. 1A includes one thermocouple 34, the substrate fixing apparatus 1 may include a plurality of thermocouples 34. In this case, the temperature of the base 31 can be controlled with higher accuracy. The plurality of thermocouples 34 in this case may be arranged at different positions along the thickness direction of the base 31.

The controller 40 includes functions to compute the temperature of the base 31 based on the thermal electromotive force obtained from the thermocouple 34, control the voltage applied to the heater element 33, and adjust the temperature of the support surface 31a of the base 31 to the predetermined temperature. The controller 40 may have a configuration including a Central Processing Unit (CPU), a Read Only Memory (ROM), a Random Access Memory (RAM), or the like, for example. The controller 40 may be mounted on a substrate, for example, and fixed to the base plate 10.

[Method of Manufacturing Substrate Fixing Apparatus]

FIG. 2A through FIG. 2C and FIG. 3A through FIG. 3C are diagrams for explaining manufacturing processes of the substrate fixing apparatus in the first embodiment. The manufacturing processes of the substrate fixing apparatus 1 will be described, by referring to FIG. 2A through FIG. 2C and FIG. 3A through FIG. 3C.

Figure 2A:
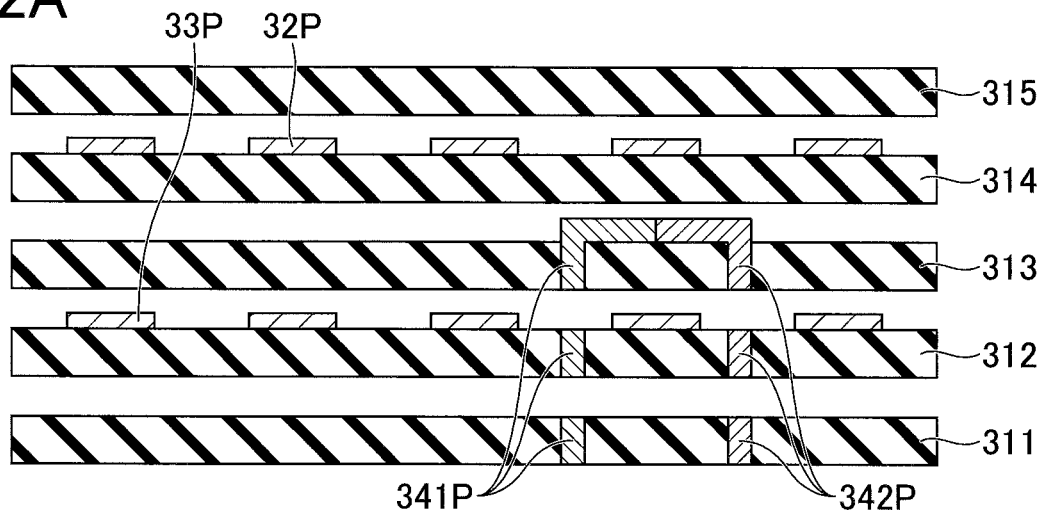
FIG. 2A, FIG. 2B, and FIG. 2C are diagrams for explaining manufacturing processes of the substrate fixing apparatus according to the first embodiment.

First, in the process illustrated in FIG. 2A, a plurality of ceramic green sheets (in this example, 5 sheets) 311, 312, 313, 314, and 315 are made by mixing a solvent and a binder to ceramic powder. In addition, through-holes are formed in the ceramic green sheets 311, 312, and 313 at the position where the thermocouple 34 is formed. The through-holes formed in the ceramic green sheets 311, 312, and 313 may have a diameter of approximately 50 μm to approximately 300 μm after the firing.

A metal paste 33P, which becomes the thermocouple 33 after the firing, is formed on one surface of the ceramic green sheet 312, and a metal paste 32P, which becomes the electrostatic electrode 32 after the firing, is formed on one surface of the ceramic green sheet 314, to the patterns illustrated in FIG. 1A, respectively. A metal paste 341P and a metal paste 342P, which respectively become the first metal part 341 and the second metal part 342 after the firing, are formed within the through-holes in the ceramic green sheets 311 and 312, and on one surface and within the through-hole of the ceramic green sheet 313, to the patterns illustrated in FIG. 1A, respectively.

The metal pastes 32P, 33P, 341P, and 342P may be formed by screen printing, for example. The metal pastes 341P and 342P formed on one surface of the ceramic green sheet 313 may have a thickness of approximately 10 μm to approximately 30 μm after the firing, and have a width of approximately 50 μm to approximately 300 μm after the firing, for example.

Figure 2B:
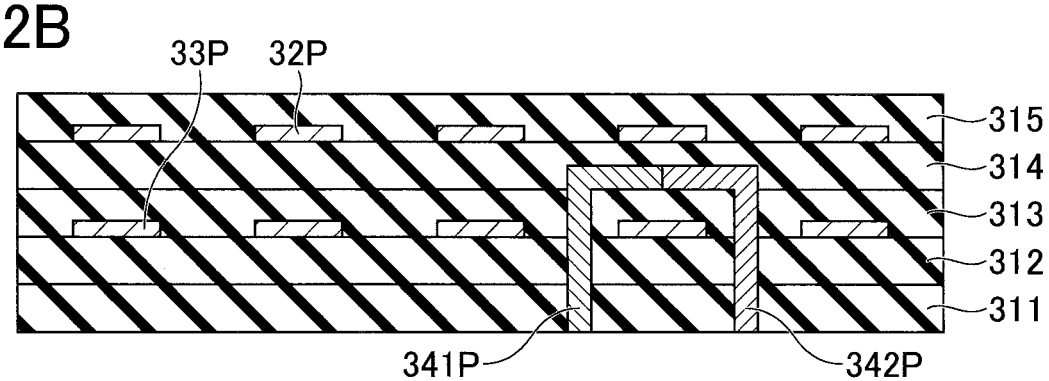

In the process illustrated in FIG. 2B, the ceramic green sheets 311, 312, 313, 314, and 315 made in the process illustrated in FIG. 2A are successively stacked to form a stacked structure.

Figure 2C:
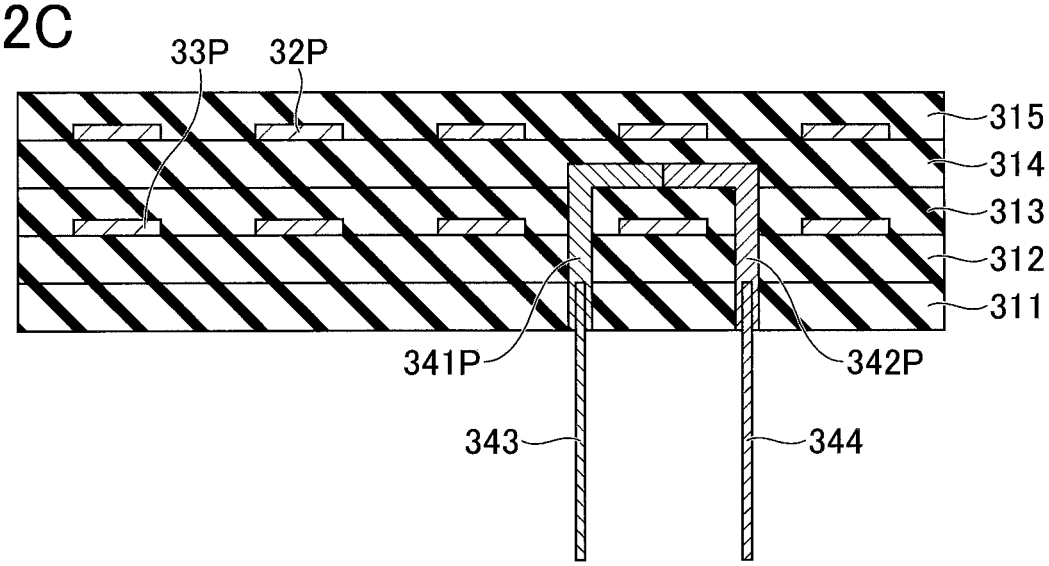

Next, in the process illustrated in FIG. 2C, the first wire part 343 and the second wire part 344 are prepared. Then, one end of the first wire part 343 is inserted into the metal paste 341P filling the inside of the through-hole in the ceramic green sheet 311, and one end of the second wire part 344 is inserted into the metal paste 342P filling the inside of the through-hole in the ceramic green plate 311, in the stacked structure illustrated in FIG. 2B. Wire diameters of the first wire part 343 and the second wire part 344 may be approximately 50 μm to approximately 300 μm, for example.

Figure 3A:
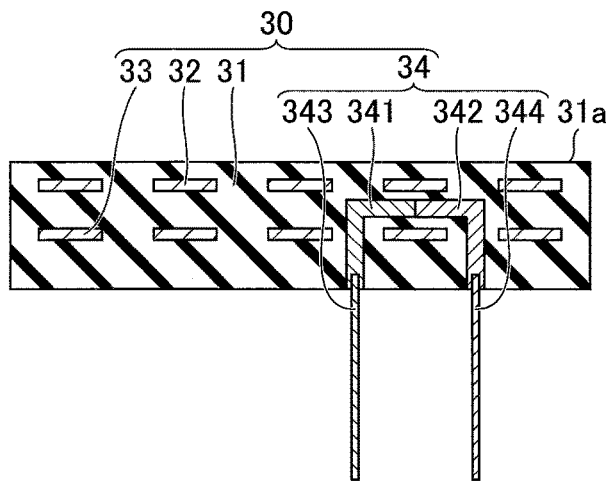
FIG. 3A, FIG. 3B, and FIG. 3C are diagrams for explaining manufacturing processes of the substrate fixing apparatus according to the first embodiment.

Next, in the process illustrated in FIG. 3A, firing of the stacked structure illustrated in FIG. 2C is performed to integrate the ceramic green sheets 311, 312, 313, 314, and 315, so as to form the base 31. In addition, the electrostatic electrode 32, the heater element 33, the first metal part 341, and the second metal part 342 are formed from the metal pastes 32P, 33P, 341P, and 342P. Further, the first metal part 341 and the first wire part 343 are connected, and the second metal part 342 and the second wire part 344 are connected. The electrostatic chuck 30 is completed by the processes described above. The wintering of the stacked structure may be performed at normal pressures. A volume of the electrostatic chuck 30 after the firing shrinks by approximately ten-odd percent when compared to the volume before the firing.

Figure 3B:
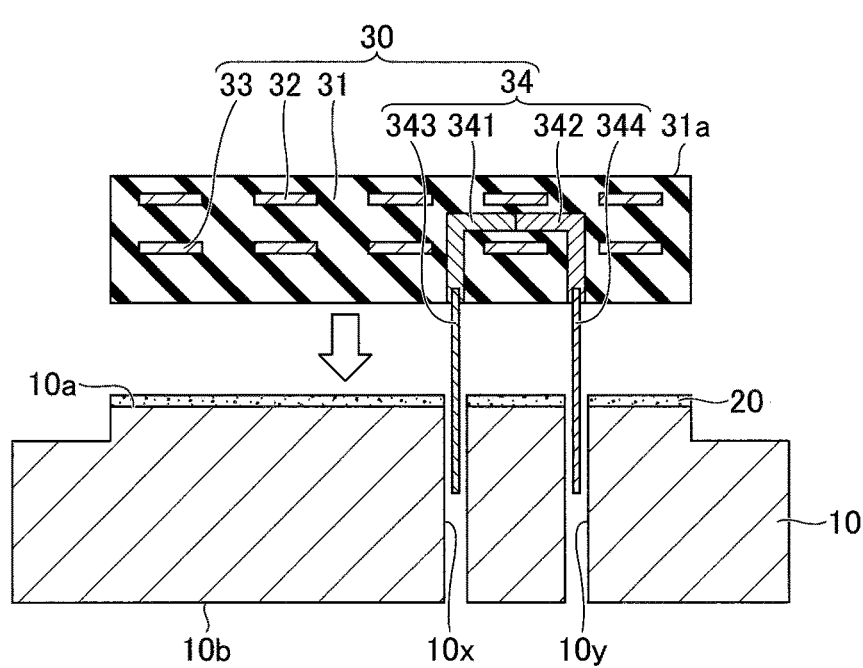

Next, in the process illustrated in FIG. 3B, the base plate 10 having the through-holes 10x and 10y is prepared, and an uncured bonding layer 20 is formed on one surface 10a of the base plate 10. Then, while inserting the first wire part 343 and the second wire part 344 of the completed electrostatic chuck 30 illustrated in FIG. 3A into the through-hole 10x and the through-hole 10y, respectively, the electrostatic chuck 30 is arranged on one surface 10a of the base plate 10 via the bonding layer 20, and the bonding layer 20 is cured.

Figure 3C:
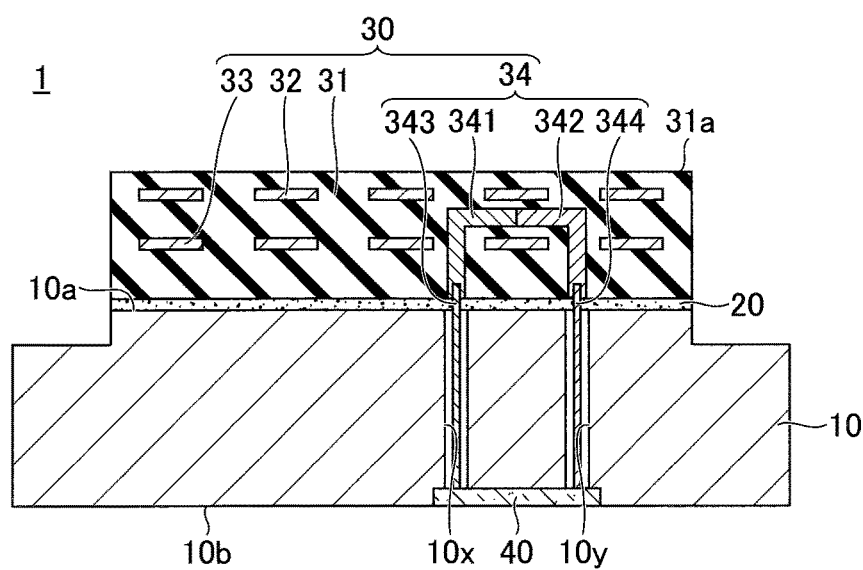

Next, in the process illustrated in FIG. 3C, the controller 40 mounted on the substrate (not illustrated), for example, is fixed to the other surface 10b of the base plate 10. In this state, the other end of the first wire part 343 and the other end of the second wire part 344 are electrically connected to the controller 40 using solder or the like. As a result, the substrate fixing apparatus 1, in which the electrostatic chuck 30 is mounted on one surface 10a of the base plate 10 via the bonding layer 20, is completed.

When embedding the thermocouple within the base of the electrostatic chuck in the conventional substrate fixing apparatus, pads are provided on end parts of the thermocouple exposed from the electrostatic chuck, and wires (copper wires or the like) made of a material different from that of the thermocouple are soldered onto the pads and drawn outside the electrostatic chuck. In other words, parts of the conventional substrate fixing apparatus, corresponding to the first wire part 343 and the second wire part 344 of the substrate fixing apparatus 1, are formed by the wires (copper wires or the like) made of the material different from that of the thermocouple.

Hence, in the conventional substrate fixing apparatus, the thermocouple is provided only within the base of the electrostatic chuck having a small temperature distribution. For this reason, an appropriate temperature difference cannot be easily generated in the thermocouple, thereby making it difficult to obtain a large thermal electromotive force.

In contrast, according to the substrate fixing apparatus 1, parts including the first wire part 343 and the second wire part 344 function as the thermocouple 34. In other words, in the substrate fixing apparatus 1, because the thermocouple 34 is arranged inside the base 31 of the electrostatic chuck 30 and inside the base plate 10, having a large temperature distribution as a whole, a temperature difference is easily generated in the thermocouple 34, thereby making it possible to obtain a large thermal electromotive force. As a result, noise immunity improves, and it is possible to accurately measure the temperature using the thermocouple 34.

Figure 4:
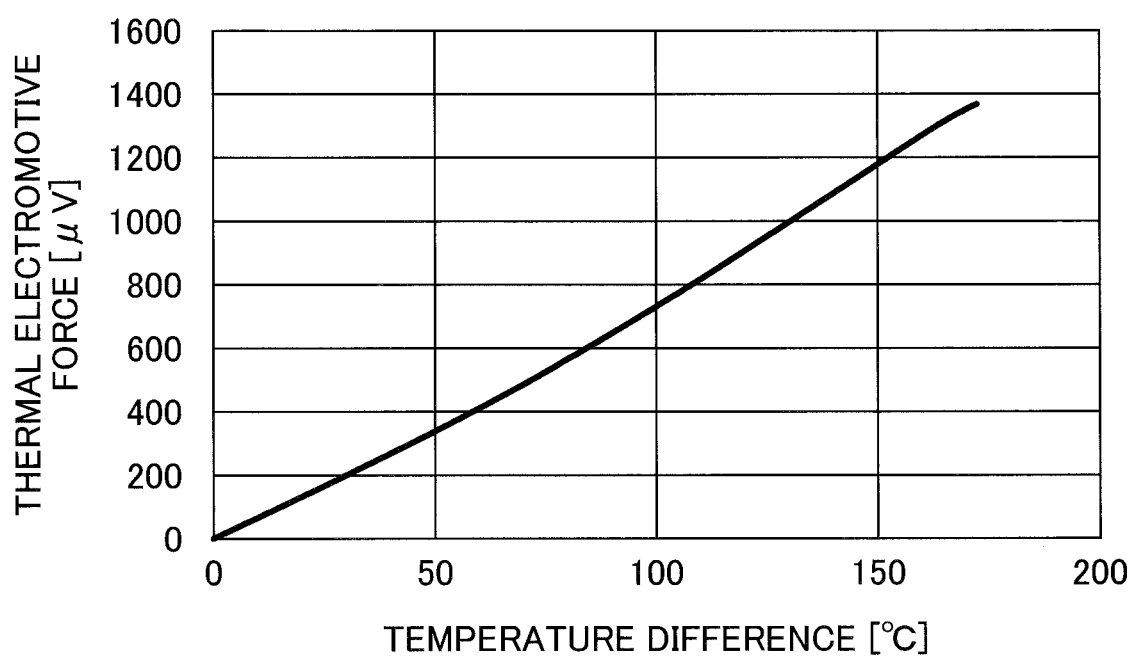
FIG. 4 is a diagram illustrating an example of a relationship between a temperature difference and a thermal electromotive force of the substrate fixing apparatus according to the first embodiment.

FIG. 4 is a diagram illustrating an example of the relationship between a temperature difference and the thermal electromotive force of the substrate fixing apparatus 1. It may be observed from FIG. 4 that a larger thermal electromotive force can be obtained with larger temperature difference.

In addition, in the substrate fixing apparatus 1, because the first wire part 343 and the second wire part 344 are drawn out to a vicinity of the other, bottom surface 10b of the base plate 10, and are directly connected to the controller 40, the thermal electromotive force does not need to be corrected, which in turn also contributes to the improvement of the accuracy of the temperature measurement using the thermocouple 34.

Further, in the substrate fixing apparatus 1, the firing of the base 31 of the electrostatic chuck 30 and the firing of the thermocouple 34 may be performed simultaneously, thereby simplifying the manufacturing process.

In the substrate fixing apparatus 1, the first metal part 341 and the first wire part 343 are connected directly, and the second metal part 342 and the second wire part 344 are connected directly, upon being subjected to firing simultaneously with the base 31. Accordingly, in contrast to conventional substrate fixing apparatuses that require the use of the pads to make such connections, the thermocouple 34 of the substrate fixing apparatus 1 can be arranged at a high density inside the base 31. In addition, even when compared to a conventional substrate fixing apparatus having a configuration in which a groove is provided in a base and a commercially available thermocouple is inserted into the groove, the thermocouple 34 of the substrate fixing apparatus 1 can be arranged at higher density inside the base 31.

The substrate fixing apparatus 1 may be shipped as a finished product. However, it is also possible to ship the electrostatic chuck 30 illustrated in FIG. 3A as the finished product. In this case, a person who acquires the electrostatic chuck 30 may perform the processes described above in conjunction with FIG. 3B and FIG. 3C, to obtain the substrate fixing apparatus 1.

Second Embodiment

The substrate fixing apparatus in a second embodiment is not provided with the controller. In the second embodiment, those parts that are the same as the first embodiment are designated by the same reference numerals, and a repeated description of the same parts may be omitted.

Figure 5:
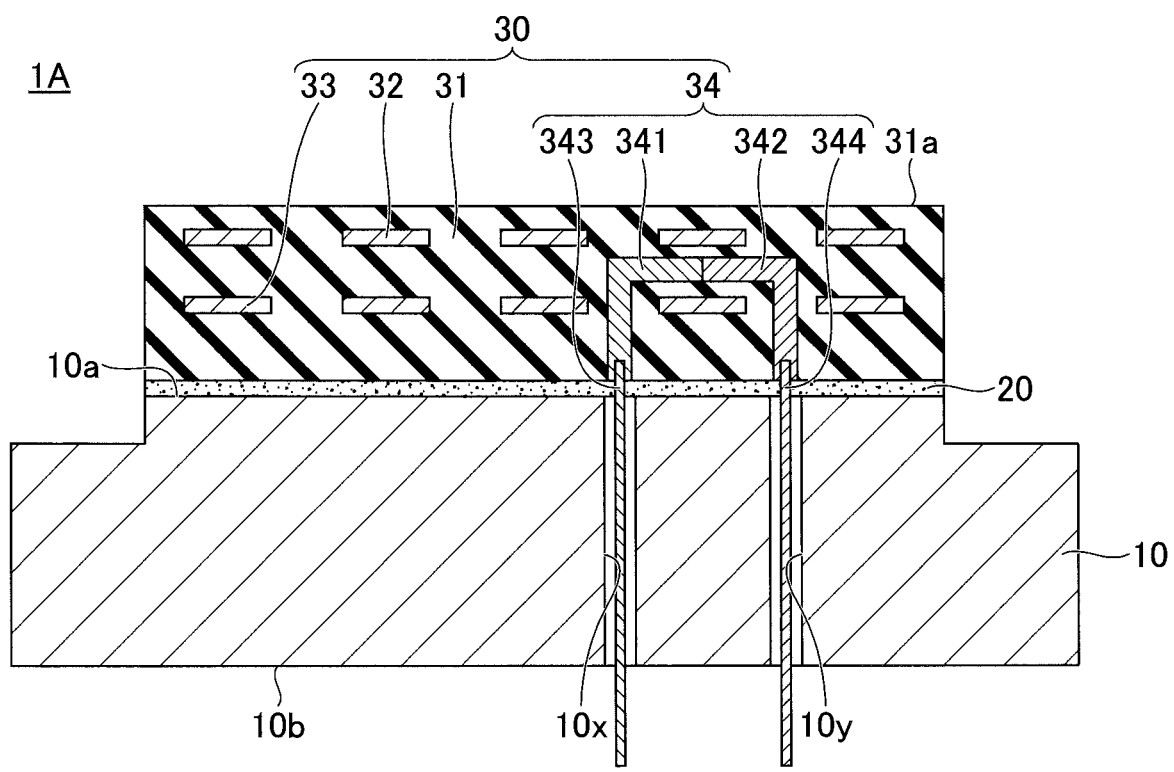
FIG. 5 is a cross sectional view illustrating a simplified example of the substrate fixing apparatus according to a second embodiment.

FIG. 5 is a cross sectional view illustrating a simplified example of the substrate fixing apparatus in the second embodiment.

As illustrated in FIG. 5, a substrate fixing apparatus 1A differs from the substrate fixing apparatus 1 illustrated in FIG. 1A, in that the substrate fixing apparatus 1A does not include the controller 40.

In the substrate fixing apparatus 1A, the end of the first wire part 343 not connected to the first metal part 341, and the end of the second wire part 344 not connected to the second metal part 342, that is, the other end of the first wire part 343 and the other end of the second wire part 344, project from the other surface 10b of the base plate 10. The ends of the first and second wire parts 343 and 344, projecting from the other surface 10b of the base plate 10, may be electrically connected to a controller at a suitable position, if required.

Hence, the controller, configured to compute the temperature of the base 31 based on the thermal electromotive force obtained from the thermocouple 34 and apply the voltage to the thermocouple 34, may be provided separately, that is, as a separate component, with respect to the substrate fixing apparatus 1A.

According to each of the embodiments described above, it is possible to accurately measure the temperature of the electrostatic chuck.

Although the embodiments are numbered with, for example, "first," or "second," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

For example, the retaining target to be retained by the substrate fixing apparatus is not limited to the substrate, such as the wafer, silicon (Si) wafer, or the like. The substrate fixing apparatus may be configured to retain a substrate, such as a glass substrate or the like used during a manufacturing process of a liquid crystal panel or the like, for example.

What is claimed is:

1. An electrostatic chuck comprising:
  a base having a support surface configured to retain a retaining target by electrostatic retention; and
  a thermocouple configured to detect a temperature of the base,
  wherein the thermocouple includes
    a first metal part and a second metal part that are provided inside the base, wherein one end of the first metal part and one end of the second metal part are connected to each other to form a measuring junction,
    a first wire part having one end connected to the other end of the first metal part inside the base, and another end extending outside the base, and
    a second wire part having one end connected to the other end of the second metal part inside the base, and another end extending outside the base,
  wherein the first metal part and the first wire part are formed from a first material, and
  wherein the second metal part and the second wire part are formed from a second material different from the first material.

2. The electrostatic chuck as claimed in claim 1, wherein the first metal part and the second metal part are covered by the base.

3. The electrostatic chuck as claimed in claim 1,
  wherein the first metal part includes
    a first horizontal portion, extending in a direction parallel to the support surface, and having the measuring junction provided on one end of the first horizontal portion, and
    a first vertical portion, extending in a direction perpendicular to the support surface from the other end of the first horizontal portion, and having one end of the first vertical portion exposed from the base, and
  wherein the second metal part includes
    a second horizontal portion, extending in the direction parallel to the support surface, and having the measuring junction provided on one end of the second horizontal portion, and
    a second vertical portion, extending in the direction perpendicular to the support surface from the other end of the second horizontal portion, and having one end of the second vertical portion exposed from the base,
  wherein the one end of the first vertical portion is connected to the first wire part, and the one end of the second vertical portion is connected to the second wire part.

4. The electrostatic chuck as claimed in claim 3, further comprising:
  an electrostatic electrode, embedded in the base, and configured to generate a Coulomb force between the base and the retaining target when applied with a voltage; and
  a heater element, embedded in the base, and configured to generate heat when applied with a voltage,
  wherein the first horizontal portion and the second horizontal portion are arranged at positions different from positions of the electrostatic electrode and the heater element along a thickness direction of the base.

5. The electrostatic chuck as claimed in claim 1, wherein the first material and the second material are conductive materials having a melting point higher than a firing temperature of the base.

6. A substrate fixing apparatus comprising:
  a base plate having a first surface, a second surface opposite to the first surface, a first through-hole, and a second through-hole; and
  an electrostatic chuck according to claim 1, mounted on the first surface of the base plate,
  wherein the first wire part is inserted into the first through-hole, and the other end of the first wire part is exposed from the second surface of the base plate, and
  wherein the second wire part is inserted into the second through-hole, and the other end of the second wire part is exposed from the second surface of the base plate.

7. The substrate fixing apparatus as claimed in claim 6, wherein the first metal part and the second metal part of the electrostatic chuck are covered by the base.

8. The substrate fixing apparatus as claimed in claim 6,
  wherein the first metal part of the electrostatic chuck includes
    a first horizontal portion, extending in a direction parallel to the support surface, and having the measuring junction provided on one end of the first horizontal portion, and
    a first vertical portion, extending in a direction perpendicular to the support surface from the other end of the first horizontal portion, and having one end of the first vertical portion exposed from the base, and wherein the second metal part of the electrostatic chuck includes
  a second horizontal portion, extending in the direction parallel to the support surface, and having the measuring junction provided on one end of the second horizontal portion, and
  a second vertical portion, extending in the direction perpendicular to the support surface from the other end of the second horizontal portion, and having one end of the second vertical portion exposed from the base,
wherein the one end of the first vertical portion is connected to the first wire part, and the one end of the second vertical portion is connected to the second wire part.

9. The substrate fixing apparatus as claimed in claim 8, wherein the electrostatic chuck further includes
an electrostatic electrode, embedded in the base, and configured to generate a Coulomb force between the base and the retaining target when applied with a voltage, and
a heater element, embedded in the base, and configured to generate heat when applied with a voltage,
wherein the first horizontal portion and the second horizontal portion are arranged at positions different from positions of the electrostatic electrode and the heater element along a thickness direction of the base.

10. The substrate fixing apparatus as claimed in claim 6, wherein the first material and the second material of the electrostatic chuck are conductive materials having a melting point higher than a firing temperature of the base.

11. A substrate fixing apparatus comprising:
a base plate having a first surface, a second surface opposite to the first surface, a first through-hole, and a second through-hole;
an electrostatic chuck according to claim 1, mounted on the first surface of the base plate; and
a controller configured to compute the temperature of the base based on a thermal electromotive force obtained from the thermocouple,
wherein the first wire part is inserted into the first through-hole, and the other end of the first wire part is electrically connected to the controller, and
wherein the second wire part is inserted into the second through-hole, and the other end of the second wire part is electrically connected to the controller.

12. The substrate fixing apparatus as claimed in claim 11, wherein the first metal part and the second metal part of the electrostatic chuck are covered by the base.

13. The substrate fixing apparatus as claimed in claim 11, wherein the first metal part of the electrostatic chuck includes
  a first horizontal portion, extending in a direction parallel to the support surface, and having the measuring junction provided on one end of the first horizontal portion, and
  a first vertical portion, extending in a direction perpendicular to the support surface from the other end of the first horizontal portion, and having one end of the first vertical portion exposed from the base, and
wherein the second metal part of the electrostatic chuck includes
  a second horizontal portion, extending in the direction parallel to the support surface, and having the measuring junction provided on one end of the second horizontal portion, and
  a second vertical portion, extending in the direction perpendicular to the support surface from the other end of the second horizontal portion, and having one end of the second vertical portion exposed from the base,
wherein the one end of the first vertical portion is connected to the first wire part, and the one end of the second vertical portion is connected to the second wire part.

14. The substrate fixing apparatus as claimed in claim 13, wherein the electrostatic chuck further includes
an electrostatic electrode, embedded in the base, and configured to generate a Coulomb force between the base and the retaining target when applied with a voltage, and
a heater element, embedded in the base, and configured to generate heat when applied with a voltage,
wherein the first horizontal portion and the second horizontal portion are arranged at positions different from positions of the electrostatic electrode and the heater element along a thickness direction of the base.

15. The substrate fixing apparatus as claimed in claim 11, wherein the first material and the second material of the electrostatic chuck are conductive materials having a melting point higher than a firing temperature of the base.

* * * * *